United States Patent
Van De Ven et al.

(10) Patent No.: US 7,423,733 B2
(45) Date of Patent: Sep. 9, 2008

(54) LITHOGRAPHIC APPARATUS, DEVICE MANUFACTURING METHOD, AND DEVICE MANUFACTURED THEREBY WITH DOCKING SYSTEM FOR POSITIONING A PATTERNING DEVICE

(75) Inventors: Bastiaan Lambertus Wilhelmus Marinus Van De Ven, 'S-Hertogenbosch (NL); Gert-Jan Heerens, Schoonhoven (NL); Robert Gabriël Maria Lansbergen, Schiedam (NL); Martinus Hendrikus Antonius Leenders, Rotterdam (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 615 days.

(21) Appl. No.: 10/894,367

(22) Filed: Jul. 20, 2004

(65) Prior Publication Data

US 2007/0159616 A1 Jul. 12, 2007

(30) Foreign Application Priority Data

Jul. 22, 2003 (EP) .................................. 03077308

(51) Int. Cl.
*G03B 27/62* (2006.01)
(52) U.S. Cl. ................................ 355/75; 355/76; 430/5
(58) Field of Classification Search .................. 355/75, 355/76, 53, 72–74; 430/5
See application file for complete search history.

(56) References Cited

U.S. PATENT DOCUMENTS 4,598,242 A 7/1986 Hayashi et al.
4,760,429 A 7/1988 O'Connor
5,229,872 A 7/1993 Mumola
5,296,891 A 3/1994 Vogt et al.
5,523,193 A 6/1996 Nelson
5,544,213 A 8/1996 Chiba et al.
5,969,441 A 10/1999 Loopstra et al.
6,046,792 A 4/2000 Van Der Werf et al.
6,260,282 B1 7/2001 Yuan et al.
2002/0043163 A1 4/2002 Novak

FOREIGN PATENT DOCUMENTS

| EP | 1 237 045 | | 9/2002 |
| EP | 1237045 | * | 9/2002 |
| JP | 6-53116 A | | 2/1994 |
| JP | 7-153663 A | | 6/1995 |
| JP | 11-184095 A | | 7/1999 |
| JP | 2000-36531 A | | 2/2000 |
| WO | WO 98/33096 | | 7/1998 |
| WO | WO 98/38597 | | 9/1998 |
| WO | WO 98/40791 | | 9/1998 |

* cited by examiner

*Primary Examiner*—Diane I. Lee
*Assistant Examiner*—Chia-how Michael Liu
(74) *Attorney, Agent, or Firm*—Pillsbury Winthrop Shaw Pittman, LLP

(57) ABSTRACT

The invention pertains to a lithographic apparatus that includes a docking system for positioning a patterning device, such as a reticle, relative to the reticle stage. The lithographic projection apparatus has an operational cycle that includes a projection phase, in which the reticle stage carries the patterning device and an exchange phase, in which the patterning device is exchanged and the docking system positions the patterning device relative to the reticle stage. The docking system is configured to be spaced from the patterning device during the projection phase in order to ensure that a higher accuracy of the projected image is obtained.

31 Claims, 5 Drawing Sheets

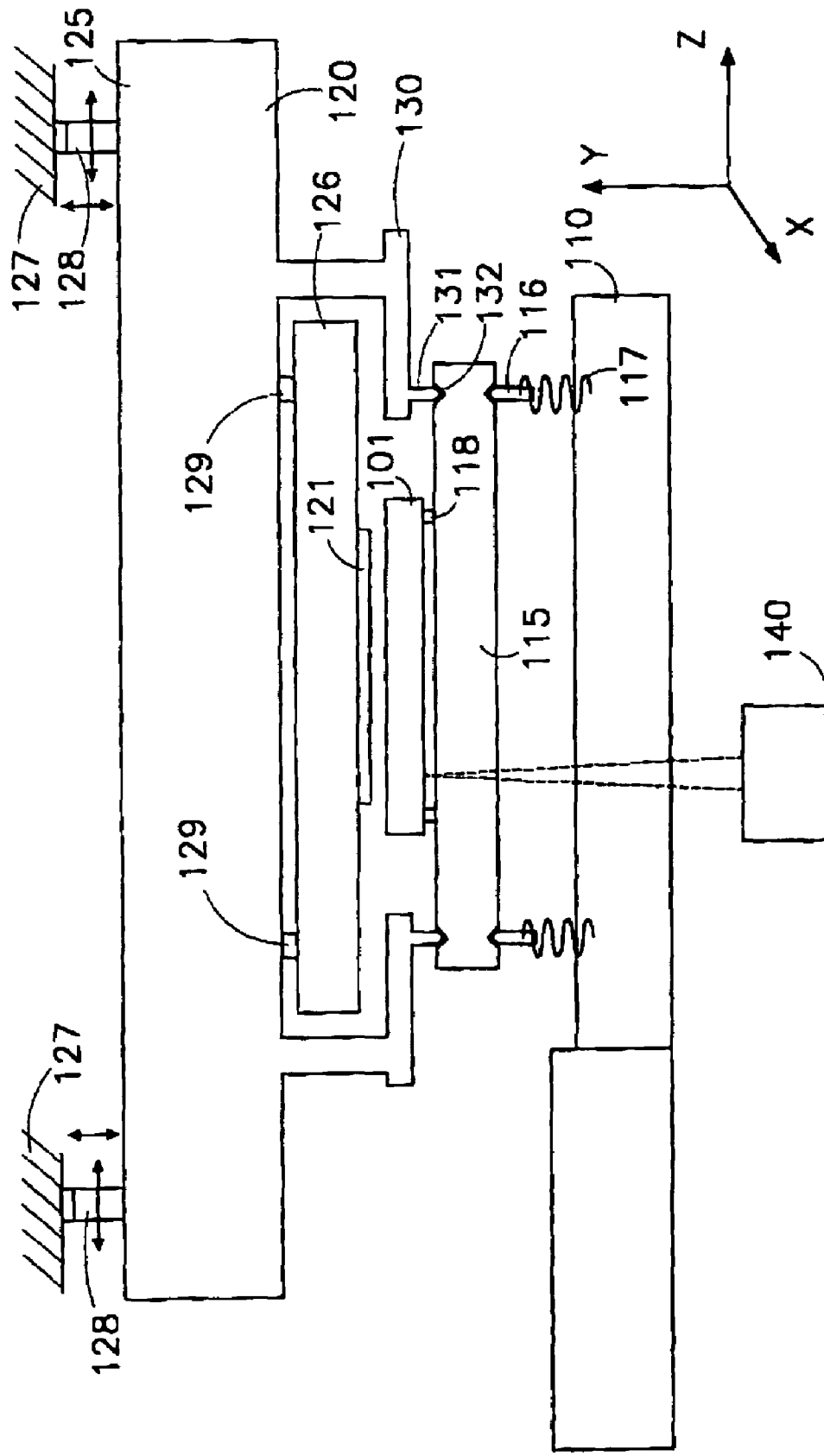

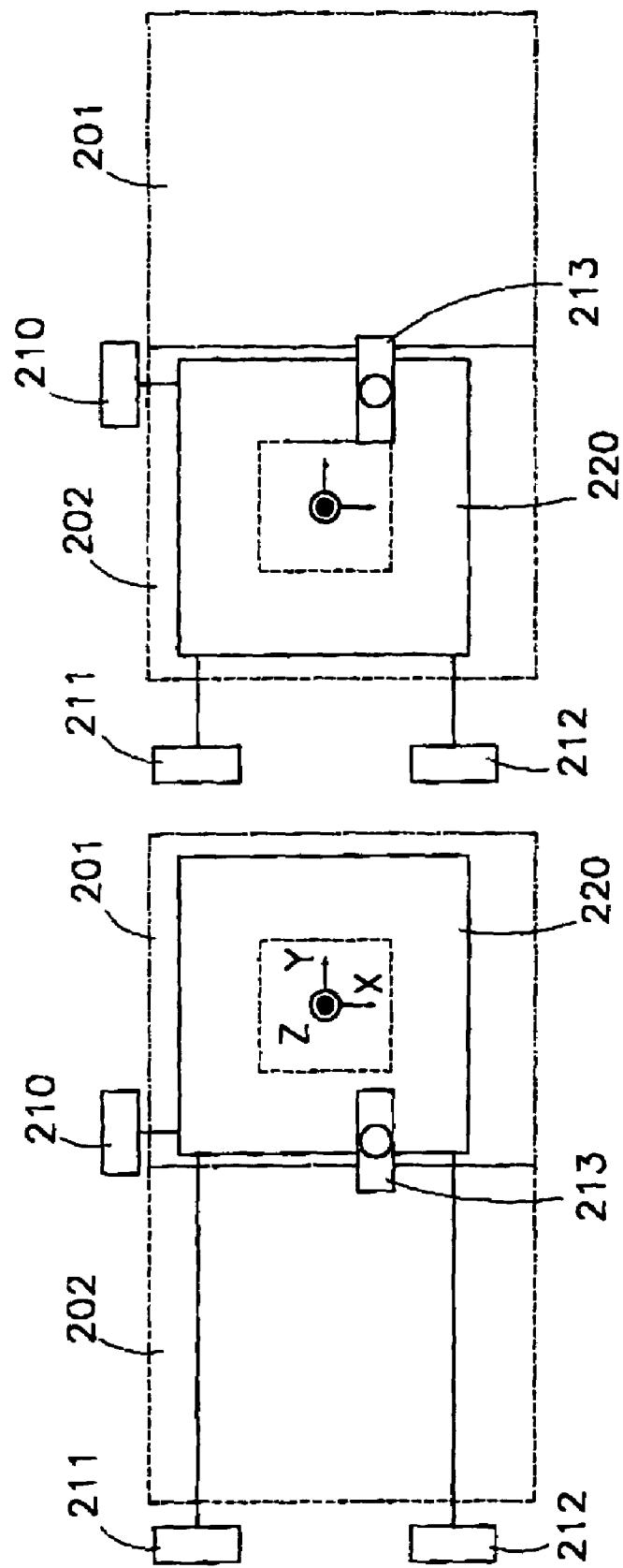

LITHOGRAPHIC APPARATUS, DEVICE MANUFACTURING METHOD, AND DEVICE MANUFACTURED THEREBY WITH DOCKING SYSTEM FOR POSITIONING A PATTERNING DEVICE

PRIORITY INFORMATION

This application claims priority from European Patent Application No. 03077308.9, filed Jul. 22, 2003 and from U.S. patent application Ser. No. 10/740,822, filed on Dec. 22, 2003, the contents of both being herein incorporated by reference in their entirety.

BACKGROUND OF THE INVENTION

1. Field of the Invention

The present invention relates to a lithographic apparatus, device manufacturing method, and an associated device manufactured thereby.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- a mask: the concept of a mask (also known as a "reticle") is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;
- a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and
- a programmable LCD array: an example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper.

In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder/holder parallel or anti-parallel to this direction. Since, in general, the projection system will have a magnification factor M (generally<1), the speed V at which the substrate table/holder/holder is scanned will be a factor M times that at which the mask table/holder/holder is scanned. More information with regard to lithographic devices as here described can be gleaned, for example, from U.S. Pat. No. 6,046,792, incorporated herein by reference.

In a manufacturing process using a lithographic apparatus, a pattern (e.g. as defined by a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate table/holder/holders (and/or two or more mask table/holders). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

It will be appreciated that the operational sequence of a lithographic apparatus comprises a projection phase, in which the projection system is active. During the projection phase, a substrate, such as a wafer, is exposed. During the projection phase, a reticle stage carries the patterning device. It should be appreciated that the term "reticle" stage as used herein is simply the stage that carries the patterning device. This can also be synonymously referred to as a "mask stage" or patterning device stage."

The operational sequence of a lithographic apparatus also comprises an exchange phase. During the exchange phase the patterning device is exchanged. In the exchange phase, a positioning system positions the patterning device relative to the reticle stage. The positioning system comprises a reticle carrier (also referred to as a "mask carrier" or "patterning device carrier"), which carries the patterning device. The positioning can be performed in different ways, for example by measuring and control or by mechanical docking. After the positioning of the patterning device relative to the reticle stage, the reticle stage takes the patterning device over from the reticle carrier, after which the reticle carrier moves away from the reticle stage. A fixing mechanism fixes the patterning device relative to the reticle stage.

In known lithographic projection systems, the patterning device is carried on top of the reticle stage. However, due to recent developments, it has become desirable to locate the patterning device below the reticle stage. This relocation introduces new design problems.

When the patterning device is carried on top of the reticle stage, gravity helps the patterning device to maintain its position relative to the reticle stage. The patterning device generally is placed in a recess of the reticle stage, so that the edges of the recess together with gravity provide the fixing of the patterning device relative to the reticle stage. In the case that the patterning device is carried below the reticle stage, this solution is no longer feasible. Therefore, it has been proposed to fix the patterning device relative to the reticle stage by clamping it to the reticle stage, for example by means of an electrostatic clamp.

Also, the need for interfaces on the patterning device grew stronger, which interfaces could be engaged for handling the patterning device without damaging the sensitive areas of the patterning device. As possible interfaces, brackets at the edges of the patterning device or a frame around the circumference of the patterning device have been proposed, as is described in European Patent Application No. 02251364.2. As an alternative, the patterning device can be provided with handling zones, which are adapted to be contacted by other machine parts.

However, more problems still have to be overcome. For example, on one hand, it is advantageous to use a mechanical docking system for positioning the patterning device relative to the reticle stage, as it is reliable, relatively cheap and easy to manufacture. On the other hand, it turns out that when a mechanical docking system is used, an optimal accuracy of the projected image could not be achieved.

Moreover, it was found that during the transfer of the patterning device from the reticle carrier to the reticle stage, inaccuracies in the positioning of the patterning device relative to the reticle stage occur. In addition, the need to reduce idle time has increased with the new developments.

SUMMARY OF THE INVENTION

The principles of the present invention, as embodied and broadly described herein, provide a lithographic system in which mechanical docking is used for positioning the patterning device relative to the reticle stage, but in which the accuracy of the image projected on the substrate is increased. In one embodiment, the lithographic apparatus comprises a substrate holder configured to hold a substrate; a radiation system configured to condition a beam of radiation; a support structure configured to support a patterning device that imparts a desired pattern onto the beam of radiation, the support structure including a stage; a projection system that projects the patterned beam onto a target portion of the substrate; and a docking system configured to position the patterning device relative to the stage. The lithographic apparatus operates in accordance with an operational cycle that comprises (a) a projection phase, in which the projection system projects the patterned beam onto the substrate target portion and the stage carries the patterning device; and (b) an exchange phase, in which the patterning device is exchanged and the docking system positions the patterning device relative to the stage. The docking system is spaced from the patterning device so as to avoid physical contact with the patterning device during the projection phase.

As all elements of the docking system are spaced from (that is: free of physical contact with) the patterning device during the projection phase, in the lithographic projection apparatus according to the first aspect of the invention the patterning device is not subjected to any force originating from the docking system in the projection phase. As a consequence, no deformation or deflection is induced by the docking system during the projection of the image on the substrate, which results in an increased accuracy of the projection of the image on the substrate.

In one embodiment, the docking system comprises a reticle carrier, which is provided with at least one support. The docking system further comprises one or more positioning elements, which are preferably connected to the reticle stage. The support of the reticle carrier is adapted to position the patterning device relative to the reticle carrier accurately and reproducibly. So, the position of the patterning device relative to the reticle carrier in general, and more particular the position of the patterning device relative to the support, is known.

By then positioning the reticle carrier, or at least the part thereof that actually carries the pattering means such as the support, accurately relative to the reticle stage, the patterning device is consequently also positioned accurately relative to the reticle stage.

In known lithographic apparatus, the reticle carrier just brings the patterning device near the reticle stage. When the patterning device comes close enough to the reticle stage, positioning elements connected to the reticle stage engage the patterning device, and then force the patterning device into the right position. This positioning of course has to take place before the patterning device can be fixed, so during this positioning the patterning device is in contact with the reticle carrier as well as with elements connected to the reticle stage. When the patterning device reaches its final position relative to the reticle stage, fixing mechanism fix the patterning device relative to the reticle stage and the reticle carrier releases the patterning device and moves away. During the projection phase, the positioning elements connected to the reticle stage stay in physical contact with the patterning device.

However, in the lithographic apparatus according to the invention, the positioning of the patterning device takes place in a more indirect way: first the patterning device is positioned relative to the reticle carrier, and then the reticle carrier is positioned relative to the reticle stage. As now, instead of the patterning device, the reticle carrier is positioned relative to the reticle stage, the positioning elements connected to the reticle stage engage the reticle carrier instead of the patterning device. This way, the positioning elements do not need to engage the patterning device for positioning the patterning device relative to the reticle stage.

As the reticle carrier is in a position away from the reticle stage during the time the projection system is active, the docking system (which comprises the positioning elements connected to the reticle stage) is free of contact from the patterning device during the projection of the image on the substrate, so it does not introduce any deflection of the patterning device during the projection phase.

In one embodiment, each support of the reticle carrier has a first positioning face, and each positioning element has a second positioning face. The first positioning face interacts with a respective second positioning face in order to position the support of the reticle carrier and thus the patterning device relative to the reticle stage. Once the reticle carrier is close enough to its final position in the x-y-plane (that is: in the plane of the patterning device), the respective first and second positioning faces contact each other and move the support on the reticle carrier—and the patterning device with it—to its final position in the x-y-plane. Preferably, each support and each positioning element is spring-mounted, in such a way that the support has the freedom to move in the three translational directions, and the positioning element can only move in the translational direction substantial perpendicular to the plane of the patterning device (z-direction). This ensures a reproducible and accurate positioning, since the interacting positioning faces will move the patterning device to its desired position in the x-y-plane by the interaction of the first and second positioning faces. After that, the reticle carrier moves the patterning device in the z-direction towards the projection system, so the clamp can take over the patterning device from the reticle carrier. This ensures a reproducible and accurate positioning of the patterning device relative to the reticle stage.

So, the patterning device first reaches its final position in the x-y-plane, before it is moved in z-direction to the reticle stage and clamped to the reticle stage. It is advantageous that movement of the patterning device in the x-y-plane is avoided when clamping the patterning device, since such a relative movement of the patterning device and the reticle stage may cause damage to the patterning device. It is however envisaged that that the patterning device is first brought into a final position in a plane different then its x-y-plane, after which it is moved into its final position relative to the reticle stage by means of a movement in other than its z-direction.

In one embodiment, the reticle carrier comprises three supports, each support having a partly spherical carrying face for carrying the patterning device. An interface of the reticle, such as a frame or a plurality of brackets, comprises three conical holes or V-shaped grooves, in which the respective carrying faces engage the patterning device. The patterning device is thus positioned accurately relative to the reticle carrier.

In this embodiment, each support comprises a hole, which is at least partly conical. The wall of this conical part forms the first positioning face. The positioning elements have at least partly a pinform shape, with a partly spherical tip area, which tip area forms the second positioning surface. The dimensions of the spherical tip area and the conical part of the hole are chosen such that the tip area fits inside the conical hole, and that it contacts the wall of the hole in a reproducible way.

The interface of the patterning device is provided with holes or grooves having a larger diameter or width, respectively, than the pinform parts of the positioning elements. The holes or grooves are arranged such that when the patterning device approaches its final position, the positioning elements project through them. In that situation, each spherical tip area of the positioning mechanism engages the wall of the conical part of the hole in a respective support. As the support has the freedom to move in the three translational directions, and the positioning element can only move in the translational direction substantial perpendicular to the plane of the patterning device, the positioning elements move the supports (and thus the patterning device with them) to their final position in the plane of the patterning device. The patterning device is thus positioned in a reproducible and accurate way relative to the reticle stage.

Finally, a translational movement in the direction substantially perpendicular to the plane of the patterning device allows the clamp to take over the patterning device from the reticle carrier. The reticle carrier moves away from the patterning device once the clamp has taken over.

This embodiment provides a construction of simple design, which is easy to manufacture and which has the merits of the apparatus according to the first aspect of the invention.

According to another embodiment, there is provided a device manufacturing method comprising providing a substrate that is at least partially covered by a layer of radiation-sensitive material; conditioning a beam of radiation; applying a patterning device to configure the conditioned beam of radiation with a desired pattern in its cross-section; carrying the patterning device in a stage during the projection phase; projecting the patterned beam of radiation onto a target portion of the first substrate during the projection phase; exchanging the patterning device during an exchange phase; and positioning the patterning device relative to the stage via a docking system during the exchange phase. The docking system is spaced from the patterning device so as to avoid physical contact with the patterning device during the projection phase.

It is a second object of the present invention to provide a lithographic projection apparatus in which the patterning device is taken over from the reticle carrier to the reticle stage in an accurate way. This object and other objects are according to the second aspect of the invention achieved in a lithographic projection apparatus, comprising a substrate holder configured to hold a substrate; a radiation system configured to condition a beam of radiation; a support structure configured to support a patterning device that imparts a desired pattern onto the beam of radiation, the support structure including a stage; a projection system that projects the patterned beam onto a target portion of the substrate; and a positioning mechanism configured to position the patterning device relative to the stage, the positioning mechanism including a reticle carrier. The lithographic apparatus operates in accordance with an operational cycle comprising (a) a projection phase, in which the projection system projects the patterned beam onto the substrate target portion and the stage carries the patterning device; and (b) an exchange phase, in which the patterning device is exchanged and the positioning mechanism positions the patterning device relative to the stage. The positioning mechanism further includes a coupling mechanism that couples the reticle carrier with the stage during the exchange phase.

The patterning device should be accurately positioned relative to the reticle stage, and that the actual position of the patterning device relative to the reticle stage after takeover from the positioning mechanism is fully and precisely known.

In previously known systems, the patterning device was positioned as accurately as possible relative to the reticle stage, and then taken over from the reticle carrier onto the reticle stage. However, due to vibrations in the system, there is relative movement between the reticle carrier and the reticle stage during takeover. The relative displacement between the patterning device and the reticle stage could amount to 50 μm or even more. Due to this relative movement, the actual position of the patterning device relative to the reticle stage has a certain uncertainty and the relative positioning suffers from a loss of accuracy. Moreover, the relative movement causes slip in the patterning device' x-y-plane between the patterning device and the reticle stage. This may cause damage to the patterning device and/or the reticle stage, and generates particles which pollute the environment inside the system. In general, an electrostatic clamp is used as a fixing mechanism to fix the patterning device relative to the reticle stage. Such a clamp is particularly sensitive to damage due to slip of the patterning device (such as scratches) and to the presence of particles between the patterning device and the clamp.

The lithographic projection system according to the second aspect of the invention is provided with coupling mechanism for coupling the reticle carrier with the reticle stage. Due to the coupling of the reticle stage and the reticle carrier, the relative movement between the patterning device, which is carried by the reticle carrier, and the reticle stage is significantly reduced. Therefore, the takeover from the patterning device from the reticle carrier to the reticle stage is far less disturbed by vibrations that cause relative movement and/or slip between the patterning device and the reticle stage.

Preferably, in the lithographic projection system according to the second aspect of the invention, the reticle carrier of the positioning mechanism is provided with an intermediate body. The intermediate body can for example be designed as a plate, or alternatively as an assembly of three spring mounted rods, in which the ends of the rods define a plane for the reticle. During the positioning of the patterning device relative to the reticle stage—which takes place in the exchange phase—, the patterning device is connected to this intermediate body in six degrees of freedom. This can for example be achieved by clamping (either mechanically or electrostatically), by making use of gravity and friction, or by the use of magnets. Of course, the intermediate body is adapted to release the patterning device during the takeover of the patterning device by the reticle stage. In this embodiment, the coupling mechanism are adapted to provide a coupling between the reticle stage and the intermediate plate.

The coupling of the reticle carrier and the reticle stage can be achieved in various ways. First, the coupling can be mechanical. In that case, the coupling mechanism preferably comprise mechanical docking mechanism, such as positioning elements having an at least partly spherical positioning face, cooperating with V-shaped grooves. Some elements of the docking mechanism are provided in the reticle stage, while others are provided in the reticle carrier, or preferably in the intermediate body thereof. In this embodiment, the reticle stage is brought into direct contact with the reticle carrier, or preferably with the intermediate body thereof. Thus the reticle carrier, or preferably the intermediate body thereof, is coupled with the reticle stage in six degrees of freedom, eliminating relative movement of the reticle stage and the reticle carrier, or preferably the intermediate body thereof.

As an alternative way of coupling, eddy current can be used. In that case, a magnetic field is generated around the reticle stage and the reticle carrier, which in this embodiment is made of an electrical conductive material. When the reticle carrier moves through the magnetic field, eddy currents occur in the reticle carrier. Due to these eddy currents, the vibration of the reticle carrier is damped. This way, the reticle carrier is coupled to the reticle stage in the sense that the relative movement between the reticle carrier and the reticle stage is very small or even zero.

In a third embodiment, the movements of the reticle stage and the reticle carrier are electronically coupled, using coupling mechanism that comprise measuring mechanism for measuring the relative position of the patterning device and the reticle stage, and control means for controlling the relative position of the patterning device and the reticle stage. In this embodiment, the position of the reticle carrier is measured during the positioning process. In addition, the control means actuate the reticle stage to make it follow the movements of the reticle carrier. This way, the relative movement between reticle carrier and the reticle stage is made very small or even zero. The system can also work the other way around: measuring the position of the reticle stage and actuating the reticle carrier accordingly.

In a preferred embodiment, the position of the patterning device relative to the reticle stage is measured once the reticle carrier has been coupled to the reticle stage. Based on the outcome of this measurement, one or more correction movements are carried out in order to obtain an optimized positioning of the patterning device relative to the reticle stage. When this optimized position is reached, the reticle stage takes over the patterning device from the reticle carrier.

In a preferred embodiment, the reticle stage comprises a long stroke unit for moving the patterning device over large distances, and a short stroke unit for moving the patterning device over small distances. The reticle carrier is the preferably coupled to the long stroke unit of the reticle stage. In that case, the correction movement can be carried out by the short stroke unit. In an alternative embodiment, it can be the other way around: coupling the reticle carrier to the short stroke unit of the reticle stage and performing correction movement with the long stroke unit.

As an alternative for using either the short stroke unit or the long stroke unit for the correction movements, dedicated actuators can be used. Such actuators can for example be mounted on the reticle carrier or on the reticle stage.

In a preferred embodiment, the coupling mechanism is provided with three positioning elements, that are connected to the long stroke unit of the reticle stage. Each of the positioning elements has an at least partly spherical positioning face, which is adapted to interact with a respective V-shaped groove in the intermediate body. Together, the positioning faces of the positioning elements position the intermediate body in the x-y-plane (that is: parallel to the plane of the patterning device), at a known distance in z-direction (that is: perpendicular to the plane of the patterning device) from the reticle stage. The positioning faces and the V-shaped grooves also maintain the position of the intermediate body relative to the reticle stage. Alternative embodiments, in which the coupling mechanism determines the position of the intermediate body in a different plane, at a distance in a different direction from the reticle stage are also envisaged.

In a preferred embodiment, the fixing mechanism of the reticle stage moves towards the patterning device to grab the patterning device.

It is also envisaged that this principle of coupling before takeover of an entity from one unit to an other can be used in different parts of a lithographic apparatus, such as in connection with a wafer stage, for example during a substrate exchange process.

In a lithographic projection system according to the aspects of the invention, the patterning device is preferably not provided with interfaces such as brackets or a frame.

According to a second further aspect of the invention there is provided a device manufacturing method comprising providing a substrate that is at least partially covered by a layer of radiation-sensitive material; conditioning a beam of radiation; applying a patterning device to configure the conditioned beam of radiation with a desired pattern in its cross-section; carrying the patterning device in a stage during the projection phase; projecting the patterned beam of radiation onto a target portion of the first substrate during the projection phase; exchanging the patterning device during an exchange phase; positioning the patterning device relative to the stage via a positioning mechanism during the exchange phase, the positioning mechanism comprising a reticle carrier; and coupling the reticle carrier with the stage during the exchange phase.

It is a third object of the invention to provide a lithographic system in the idle time of the projection system is reduced. This object and other objects are according to the third aspect of the invention achieved in a lithographic projection apparatus, comprising: a substrate holder configured to hold a substrate; a radiation system configured to condition a beam of radiation; a support structure configured to support a patterning device that imparts a desired pattern onto the beam of radiation, the support structure including a stage; a projection system that projects the patterned beam onto a target portion of the substrate; and a positioning mechanism configured to position the patterning device relative to the stage, the positioning mechanism including a reticle carrier. The lithographic apparatus operates in accordance with an operational cycle comprising (a) a projection phase, in which the projection system projects the patterned beam onto the substrate target portion and the stage carries the patterning device; and (b) an exchange phase, in which the patterning device is exchanged and the positioning mechanism positions the patterning device relative to the stage, the stage being adapted to perform a loading stroke that extends between an operational area for the patterning device and an exchange area for the patterning device. A measuring mechanism is configured to measure the position of the stage along the plane of the patterning device, the first measuring mechanism comprising a sensor that measures the position of the stage in the direction perpendicular to the direction of the loading stroke. The exchange area is arranged relative to the operational area such that the sensor is able to measure the position of the stage in the operational area during the projection phase and the exchange area during the exchange phase.

The third object and other objects are according to the third aspect of the invention also achieved in a lithographic projection apparatus, comprising a substrate holder configured to hold a substrate; a radiation system configured to condition a beam of radiation; a support structure configured to support a patterning device that imparts a desired pattern onto the beam of radiation, the support structure including a stage; a projection system that projects the patterned beam onto a target portion of the substrate; and a positioning mechanism configured to position the patterning device relative to the stage, the positioning mechanism including a reticle carrier. The lithographic apparatus operates in accordance with an operational cycle comprising (a) a projection phase, in which the projection system projects the patterned beam onto the substrate target portion and the stage carries the patterning device; and (b) an exchange phase, in which the patterning device is exchanged and the positioning mechanism positions the patterning device relative to the stage, the stage being adapted to perform a loading stroke that extends between an operational area for the patterning device and an exchange area for the patterning device. A measuring mechanism is configured to measure the position of the stage perpendicular to the plane of the patterning device, the second measuring mechanism comprising a sensor, and the exchange area is arranged relative to the operational area such that the sensor is able to measure the position of the stage in the operational area during the projection phase and the exchange area during the exchange phase.

During the projection phase, the patterning device is in an operational area. Any displacements of the patterning device, whether due to operational movements or to disturbances such as vibrations, are measured.

In the exchange area, a patterning device is unloaded from the reticle stage during the exchange phase, and an other patterning device is loaded to the reticle stage. This exchange of patterning device usually takes place outside of the operational area of the patterning device, for otherwise the projection system would be in the way, or the projection system could be damaged if something goes wrong in the exchange process.

In known lithographic systems, an x-sensor measures the position of the reticle stage in the plane of the patterning device in the direction perpendicular to the direction of the loading stroke when the patterning device is displaced inside the operational area. The direction perpendicular to the direction of the loading stroke is the x-direction; the direction of the loading stroke is the y-direction. The plane formed by the x- and y-direction (the x-y-plane) is the plane of the patterning device. For measuring the position of the reticle stage in the x-direction in the exchange area, a separate x-sensor is required.

In known lithographic systems, a z-sensor measures the position of the reticle stage in the direction perpendicular to the plane of the patterning device when the patterning device is displaced inside the operational area. The direction perpendicular to the plane of the patterning device is the z-direction. For measuring the position of the reticle stage in the z-direction in the exchange area, a separate z-sensor is required.

It has been found that the use of separate x- and z-sensors for the exchange area leads to additional idle time of the projection system. When a patterning device has to be exchanged, the reticle stage brings it form the operational area to the exchange area. As the x- and/or the z-sensor loses contact with the reticle stage, it switches off. As soon as the exchange area x- and/or z-sensor detects the reticle stage, it switches on. Then, the first pattering means is exchanged for a second patterning device.

When the second patterning device has been loaded to the reticle stage, the reticle stage takes the pattering means to the operational area. As the reticle stage re-enters the operational area, the x-and/or z-sensor for the operational area has to be restarted and calibrated before the projection system can begin the projection process. Otherwise, the required accuracy of the measurements of the x-position and/or the z-position of the patterning device in the projection area cannot be guaranteed.

So, when there are separate x- and/or z-sensors for the operational area and the exchange area, per measuring direction two sensor starts and a sensor calibration cycle have to be performed during the patterning device exchange process. During this, the projection system is idle.

The sensor restarts and sensor calibrations can be eliminated when the measurement of the x-position of the reticle stage is carried out by the same x-sensor in both the operational area and the exchange area, and when the measurement of the z-position of the reticle stage is carried out by the same z-sensor in both the operational area and the exchange area. This way, the idle time of the projection system can be reduced.

According to the third aspect of the invention, this is achieved by arranging the exchange area closer to the operational area (as compared to known lithographic apparatus), such that the same x-sensor and/or z-sensor can be used for measuring the position of the reticle stage in both areas. An additional advantage of this that the total stroke of the reticle stage is reduced. This is particularly advantageous lithographic projection systems in which the projection process takes place in vacuum, since in this case the dimensions of the vacuum chamber can be reduced also.

Preferably, the x-sensor and/or the z-sensor comprises an interferometer. In that case, it has been observed that the takeover of the patterning device from a positioning system to the reticle stage is performed more accurately than in known lithographic projection apparatus.

It is essential to the apparatus according to the third aspect of the invention that the x- and/or the z-sensor set do not loose contact with the reticle stage during the patterning device exchange process, and that the sensors do not need to be restarted, nor calibrated during the patterning device exchange process. This however does not imply that the x-sensor and/or the z-sensor have to be carried out as single sensors. Assembled sensor sets are also deemed possible.

It is envisaged that the principle of the third aspect of the invention is also applied to other parts of a lithographic apparatus, such as a substrate table.

According to a third further aspect of the invention there is provided a device manufacturing method, comprising providing a substrate that is at least partially covered by a layer of radiation-sensitive material; conditioning a beam of radiation; applying a patterning device to configure the conditioned beam of radiation with a desired pattern in its cross-section; carrying the patterning device in a stage during the projection phase, projecting the patterned beam of radiation onto a target portion of the first substrate during the projection phase; exchanging the patterning device during an exchange phase. The stage is adapted to perform a loading stroke extends between an operational area for the patterning device and an exchange area for the patterning device during the exchange phase, wherein the position of the stage along the plane of the patterning device is measured via a measuring mechanism that comprises a sensor that measures the position of the stage in the direction perpendicular to the direction of the loading stroke, and the exchange area is arranged relative to the operational area such that the sensor is able to measure the position of the stage in the operational area during the projection phase and in the exchange area during the exchange phase.

According to a third further aspect of the invention there is also provided a device manufacturing method, comprising providing a substrate that is at least partially covered by a layer of radiation-sensitive material; conditioning a beam of radiation; applying a patterning device to configure the conditioned beam of radiation with a desired pattern in its cross-section; carrying the patterning device in a stage during the projection phase, projecting the patterned beam of radiation onto a target portion of the first substrate during the projection phase; exchanging the patterning device during an exchange phase. The stage is adapted to perform a loading stroke extends between an operational area for the patterning device and an exchange area for the patterning device during the exchange phase, wherein the position of the stage perpendicular to the plane of the patterning device is measured via a measuring mechanism that comprises a sensor, and the exchange area is arranged relative to the operational area such that the sensor is able to measure the position of the stage in the operational area during the projection phase and in the exchange area during the exchange phase.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which:

FIG. 4 depicts a schematic overview of a relevant part of a lithographic projection apparatus according to the second aspect of the invention;

FIGS. 5A,B depict a schematic overview of a relevant part of a lithographic projection apparatus according to the third aspect of the invention.

DETAILED DESCRIPTION OF THE INVENTION

Figure 1:
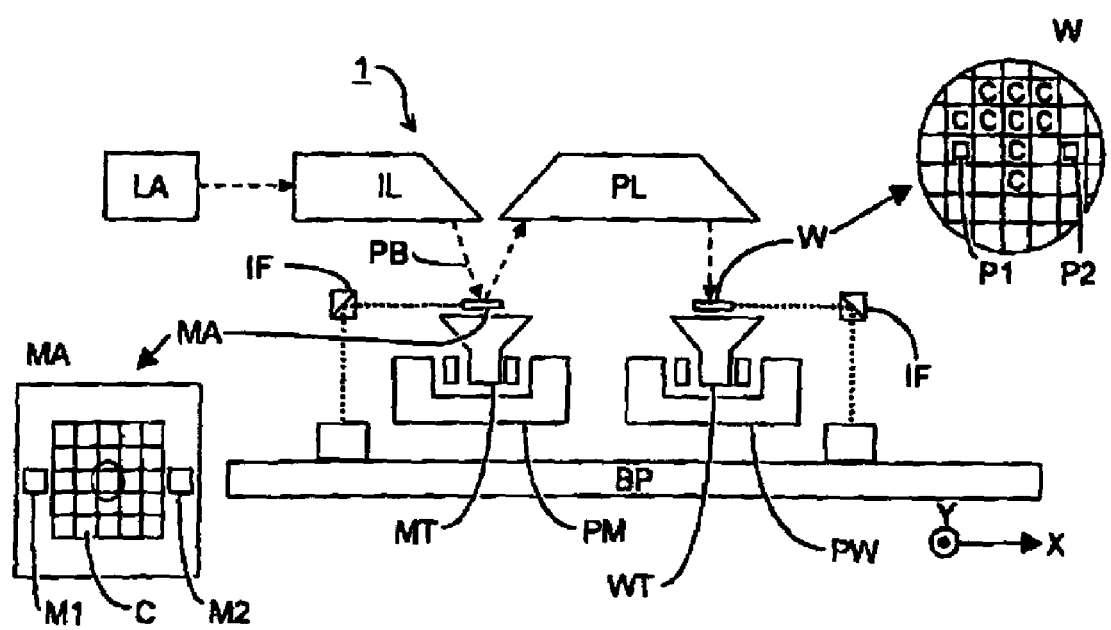
FIG. 1 depicts schematically a lithographic projection apparatus according to an embodiment of the invention.

FIG. 1 schematically depicts a lithographic projection apparatus 1 according to a particular embodiment of the invention. The apparatus comprises:

- a radiation system Ex, IL: for supplying a projection beam PB of radiation (e.g. EUV, DUV, or UV radiation). In this particular case, the radiation system also comprises a radiation source LA;
- a first object table (mask table/holder/holder) MT: provided with a mask holder for holding a mask MA (e.g. a reticle), and connected to first positioning mechanism for accurately positioning the mask with respect to item PL;
- a second object table (substrate table/holder) WT: provided with a substrate holder for holding a substrate W (e.g. a resist-coated silicon wafer), and connected to second positioning mechanism for accurately positioning the substrate with respect to item PL;
- a projection system ("lens") PL: for example, a mirror or refractive lens system that images an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. a laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;

scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
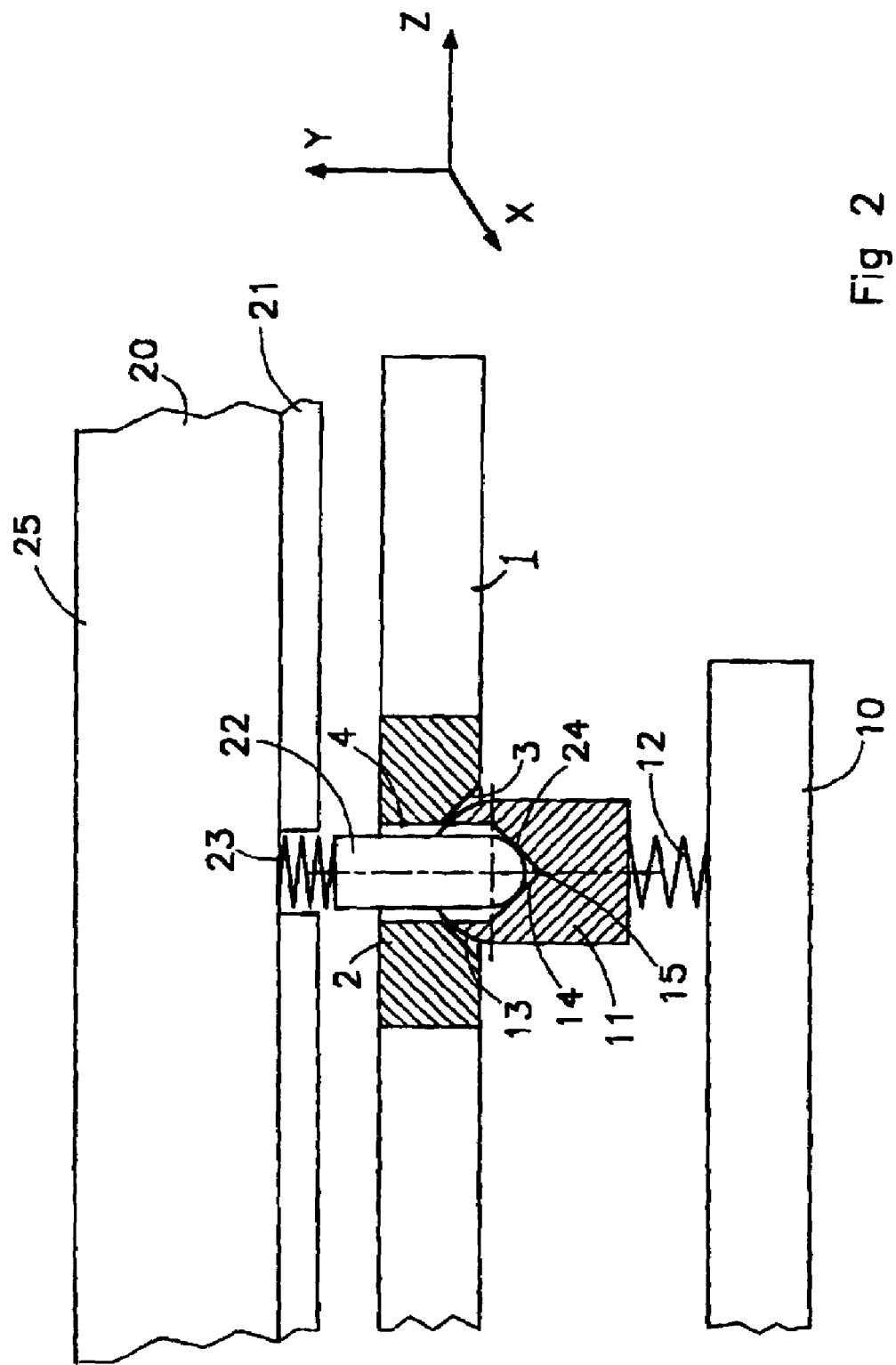
FIG. 2 depicts a schematic overview of a relevant part of a lithographic projection apparatus in which the first aspect of the invention has been incorporated.

FIG. 2 shows a schematic overview of a relevant part of a lithographic projection apparatus according to the first aspect of the invention. A reference coordinate system, comprising directions x, y and z is indicated in FIG. 2. As can be seen, the x-y-plane is the plane of the patterning device (in this case reticle 1), and z is the direction perpendicular to that plane.

In the embodiment of FIG. 2, the patterning device used is a reticle 1. This reticle 1 can either be transmissive of reflective. Brackets 2 are provided at least three locations on the circumference of the reticle 1. Each of the brackets 2 is provided with a cylindrical hole 4 and a V-shaped groove 3.

During positioning of the reticle 1 relative to the reticle stage 25, the reticle 1 is carried by a reticle carrier 10. The reticle carrier 10 comprises three supports 11. Each of the supports 11 is mounted on a spring 12, which allows the support 11 to move in x-, y- and z-direction. Each of the supports has a partly spherical carrying face 13 for carrying the reticle 1. Carrying face 13 is dimensioned in such a way that it fits in V-shaped groove 3 of the respective reticle bracket 2. Due to the interaction between V-shaped groove 3 and carrying face 13, the reticle 1 is positioned accurately and reproducibly relative to the supports of the reticle carrier 10. Each of the supports 11 is provided with a first positioning face 14, which is in this case the conical wall part of hole 15.

The docking system comprises three positioning elements 22. Each of the positioning elements 22 is spring-mounted, as is schematically represented by spring 23. The positioning elements 22 are mounted in such a way that they can only move in z-direction. This can for example be achieved by mounting each of the positioning elements 22 on two mutually parallel leaf springs.

Each of the positioning elements 22 is attached to the mirror block 20, which forms a part of reticle stage 25. At the mirror block a clamp 21, which is for example an electrostatic clamp, is present for fixing the reticle 1 relative to the mirror block 20.

Each of the positioning elements 22 is also provided with a second positioning face 24, which is in this case a partly spherical tip area. Second positioning face 24 is dimensioned in such a way that it fits in hole 15 of the respective support 11. Due to the interaction between second positioning face 24 and first positioning face 14, the supports 11 are positioned accurately and reproducibly relative to the positioning elements 22. As the reticle 1 is positioned accurately and reproducibly relative to the supports, the reticle 1 is also positioned accurately and reproducibly relative to the positioning elements 22, and thus to the reticle stage 25.

Figure 3A:
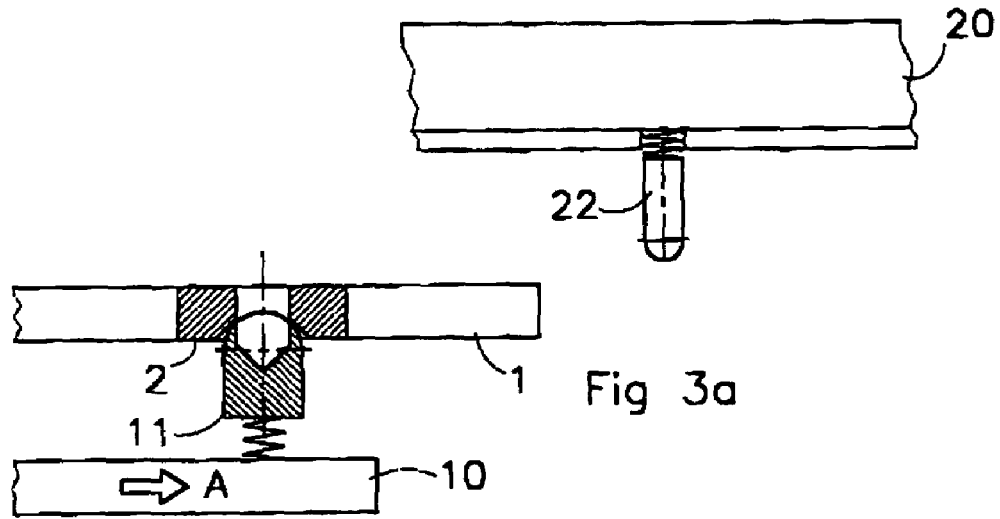
FIGS. 3A, 3B, 3C depict a schematic overview of the docking process in a lithographic projection apparatus according to the first aspect of the invention.

In operation, the reticle 1 is placed onto the supports 11, in such a way that the carrying faces 13 are in contact with the walls of the V-shaped grooves 3 (cf. FIG. 3A). The reticle carrier 10 which now carries the reticle 1 is then moved towards the mirror block 20. This movement takes place mainly in the x-y-plane (arrow A in FIG. 3A).

Figure 3B:
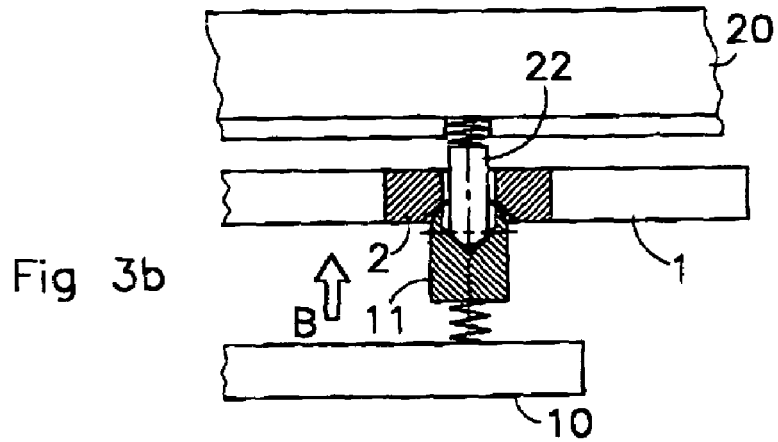

When the reticle 1 approaches its docking position, the positioning elements 22 move through the holes 4 on the brackets 2, and under the influence of the springs 23, the positioning elements 22 will come to project through the holes 4, each into the hole 15 of each respective support 11 (see, e.g., FIG. 3B).

As the positioning elements 22 can only move in z-direction, they move the supports 11 in the x-y-plane until each second positioning surface 24 has "found" its respective first positioning face 14, that is in this case when each second positioning surface 24 is in contact with its respective first positioning surface 14 at least three points over its circumference, so that an equilibrium of forces is achieved (such as shown in FIG. 2). Then, the reticle 1 has reached its final position in the x-y-plane.

Figure 3C:
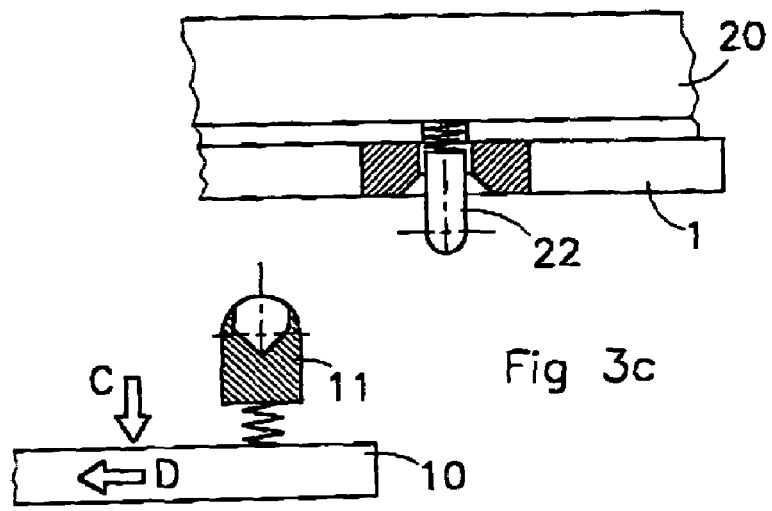

After positioning the reticle 1 in the x-y-plane, the reticle carrier 10 moves in z-direction towards the mirror block 20 (arrow B in FIG. 3B). The supports 11 take the positioning elements 22 along with them in z-direction, which is allowed by the springs 23. When the reticle 1 has reached its final position in z-direction too, the clamp 21 becomes active, and fixes the reticle 1 relative to the mirror block 20. The reticle carrier 10 is then withdrawn, first moving away from the mirror block 20 in z-direction, and then moving out of the way of the projection system substantially in the x-y-plane (cf. FIG. 3C, arrows C and D). Now, the docking system is ready for the projection system to become active.

As is clear from FIG. 2, the diameter of the positioning element 22 (for which in the shown embodiment a pinform element is used), is significantly smaller that the diameter of the hole 4 through which it projects. This is essential to the apparatus according to the first aspect of the invention, since in this way the docking system is free of contact from the reticle when the projection system is active. So, the docking system does not apply any mechanical load onto the reticle when the projection system is active, and therefore the docking system causes no deflection or deformation of the reticle. This improves the accuracy of the projected image.

FIG. 4 depicts a schematic overview of a relevant part of a lithographic projection apparatus according to another embodiment of the invention. FIG. 4 shows a reticle stage 120 for moving the reticle 101 relative to the projection system. The reticle stage 120 comprises a long stroke unit 125 and a short stroke unit 126. Between the long stroke unit 125 and the short stroke unit there are connections 129, that allow movement of the short stroke unit 126 relative to the long stroke unit 125. The short stroke unit 126 comprises a clamp 121 for fixing the reticle 101 relative to the reticle stage 120. The reticle stage is connected to supports 127 via connections 128, that allow movement of the reticle stage 120 relative to the supports 127.

The apparatus further comprises a positioning mechanism, for positioning the reticle 101 relative to the reticle stage 120. The positioning mechanism comprise a reticle carrier 110 with an intermediate body 115, which in the shown embodiment is a spring mounted plate. Supports 116, each mounted on a spring 117 carry the intermediate body 115. The reticle 101 is connected with the intermediate body 115 in six degrees of freedom during the positioning of the reticle 101 relative to the reticle stage 120. The connection means 118 between the reticle 101 and the intermediate body 115 can be for example a mechanical or electrostatic clamp, a magnet system or a system that uses a combination of gravity and friction. Of course, the connection means 118 between the intermediate body 115 and the reticle 101 is switched off during the takeover of the reticle 101 by the reticle stage.

Also, the apparatus comprises a coupling mechanism 130 for coupling the intermediate body 115 with the reticle stage 120. Due to the coupling of the reticle stage 120 and the intermediate body 115, the relative movement between the reticle 101 and the reticle stage 120 is significantly reduced or even turned to zero. Therefore, the takeover from the reticle 101 from the reticle carrier 110 to the reticle stage 120 is far less disturbed by vibrations that cause relative movement and/or slip between the reticle 101 and the reticle stage 120.

In the embodiment shown in FIG. 4, the coupling mechanism comprise mechanical docking mechanism, more in particular positioning elements 131 connected to the reticle stage and having an at least partly spherical positioning face, and V-shaped grooves 132 in the intermediate body 115. In this embodiment, the positioning elements 131 and the V-shaped grooves 132 together provide direct contact between the reticle stage 130 and the intermediate body 115. This way the reticle stage 120 and the intermediate body 115 are coupled in six degrees of freedom, thus eliminating relative movement.

In the embodiment of FIG. 3, the coupling mechanism 130 comprises three positioning elements 131, that are connected to the long stroke unit 125 of the reticle stage 120. Each of the positioning elements 131 has an at least partly spherical positioning face, which is adapted to interact with a respective V-shaped groove 132 in the intermediate body 115. Together, the positioning faces of the positioning elements 131 position the intermediate body 115 in the x-y-plane (that is, substantially parallel to the plane generally defined by the reticle 101), at a known distance in z-direction (that is, substantially perpendicular to the plane generally defined by the reticle 101) from the reticle stage 120. The positioning faces and the V-shaped grooves 132 also maintain the position of the intermediate body 115 relative to the reticle stage 120. Alternative embodiments, in which the coupling mechanism determines the position of the intermediate body in a different plane, at a distance in a different direction from the reticle stage are also envisaged.

As an alternative to the mechanical docking mechanism, eddy current coupling mechanism or electronic coupling can be used. Also, electronic coupling is envisaged. In that case, the movements of the reticle stage 101 and the intermediate body 115 are electronically coupled, using coupling mechanism that comprise measuring mechanism for measuring the relative position of the reticle 101 and the reticle stage 120, and control means for controlling the relative position of the reticle 101 and the reticle stage 120. In this embodiment, the position of the intermediate body 115 is measured during the positioning process. In addition, the control means actuate the reticle stage 120 to make it follow the movements of the intermediate body 115. This way, the relative movement between the intermediate body 115 and the reticle stage 120 is made very small or even zero.

In a preferred embodiment, the position of the reticle 101 relative to the reticle stage 120 is measured once the intermediate body 115 has been coupled to the reticle stage 120. For this, a positioning measuring system comprising a sensor 140 is provided in the embodiment of FIG. 3. Based on the outcome of this measurement, one or more correction movements are carried out in order to obtain an optimized positioning of the reticle 101 relative to the reticle stage 120. When this optimized position is reached, the reticle stage 120 takes over the reticle 101 from the intermediate body 115. Preferably, the clamp 121 of the short stroke unit 126 moves towards the reticle 101 in z-direction to grab the reticle 101.

In the embodiment of FIG. 4, the intermediate body 115 is coupled to the long stroke unit 125 of the reticle stage 120. In that case, the correction movement is preferably carried out by the short stroke unit 126.

As an alternative for using either the short stroke unit 126 or the long stroke unit 125 for the correction movements, dedicated actuators can be used. Such actuators can for example be mounted on the reticle carrier 110 or on the reticle stage 120.

FIG. 5A, B depict a schematic overview of a relevant part of a lithographic projection apparatus according to the third aspect of the invention. FIG. 5A shows the reticle stage 220 in the operational area 201. The position of the reticle stage 220 is measured in the plane of the patterning device (the x-y-plane). The measurement of the reticle stage position in the y-direction is performed by the y-sensors 211 and 212 of a positioning measuring system, while the reticle stage position in the x-direction is measured by the x-sensor 210 of a positioning measuring system. Based on the measurements of both y-sensors 211 and 212, the rotational position of the reticle stage relative to the z-axis is determined.

Also, the position of the reticle stage 220 perpendicular to the plane of the patterning device is measured by a positioning measuring system. For this, a z-sensor 213 is used.

FIG. 5B shows the reticle stage 220 in the exchange area 202. A single x-sensor 210 measures the x-position of the reticle stage 220 in the operational area as well as in the exchange area. Also, a single z-sensor 213 measures the z-position of the reticle stage 220 in both the operational area and the exchange area. In order to achieve this, the exchange area 202 is arranged close to the operational area 201.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   a substrate holder configured to hold a substrate;
   an illuminator configured to condition a beam of radiation;
   a support structure configured to support a patterning device that is configured to impart a desired pattern to the beam of radiation, the support structure including a stage;
   a projection system configured to project the patterned beam onto a target portion of the substrate; and
   a docking system configured to position the patterning device relative to the stage,
   wherein the lithographic apparatus operates in accordance with an operational cycle comprising (a) a projection phase, in which the projection system projects the patterned beam onto the substrate target portion and the stage carries the patterning device; and (b) an exchange phase, in which the patterning device is exchanged and the docking system positions the patterning device relative to the stage,
   wherein the docking system is spaced from the patterning device during the projection phase, and
   wherein the docking system includes a part coupled to the stage and spaced from the patterning device during the projection phase.

2. The lithographic apparatus of claim 1, wherein the docking system comprises:
   a reticle carrier having one or more supports on which the patterning device is positioned relative to the reticle carrier, and
   one or more positioning elements to position the supports of the reticle carrier relative to the stage.

3. The lithographic apparatus of claim 2, wherein each of the supports has a carrying face and a first positioning face and each of the positioning elements has a second positioning face and that the first positioning face and the second positioning face are arranged to interact with each other in order to position the reticle carrier relative to the reticle stage during docking of the patterning device relative to the stage.

4. The lithographic apparatus of claim 2, wherein the patterning device comprises an interface to position the patterning device relative to the reticle carrier, the interface configured to interact with the carrying face of one or more of supports of the reticle carrier.

5. The lithographic apparatus of claim 4, wherein the positioning elements project through holes in the interface of the patterning device during the projection phase.

6. The lithographic apparatus of claim 1, wherein during the exchange phase, the docking system is configured to couple the patterning device to the stage.

7. The lithographic apparatus of claim 1, wherein the docking system includes a first part coupled to the stage and a second part, separate from the stage, and wherein the first and second part are configured to cooperate with each other during the exchange phase.

8. The lithographic apparatus of claim 1, wherein the docking system comprises a patterning device carrier including a support configured to support the patterning device, the support constructed and arranged to abut both the patterning device and the part during the exchange phase.

9. A device manufacturing method, comprising:
   imparting a beam of radiation with a desired pattern in its cross-section, by use of a patterning device that is carried by a stage;
   projecting the patterned beam of radiation onto a target portion of a substrate during a projection phase;
   exchanging the patterning device during an exchange phase; and
   positioning the patterning device relative to the stage via a docking system during the exchange phase, wherein the docking system is spaced from the patterning device during the projection phase, and wherein the docking system includes a part coupled to the stage and spaced from the patterning device during the projection phase.

10. The method of claim 9, wherein the positioning includes coupling the patterning device to the stage during the exchange phase.

11. A lithographic apparatus, comprising:
a substrate holder configured to hold a substrate;
an illuminator configured to condition a beam of radiation;
a support structure configured to support a patterning device that is configured to impart a desired pattern to the beam of radiation, the support structure including a stage;
a projection system configured to project the patterned beam onto a target portion of the substrate; and
a positioning mechanism configured to position the patterning device relative to the stage, the positioning mechanism including a reticle carrier,
wherein the lithographic apparatus operates in accordance with an operational cycle comprising (a) a projection phase, in which the projection system projects the patterned beam onto the substrate target portion and the stage carries the patterning device; and (b) an exchange phase, in which the patterning device is exchanged and the positioning mechanism positions the patterning device relative to the stage, and
wherein the positioning mechanism further includes a coupling mechanism, separate from the patterning device, that is configured to couple the reticle carrier with the stage during the exchange phase.

12. The lithographic apparatus of claim 11, wherein the reticle carrier comprises an intermediate body adapted to be connected with the patterning device along six degrees of freedom and the coupling mechanism is adapted to couple the intermediate body with the reticle stage during the exchange phase.

13. The lithographic apparatus of claim 12, wherein the coupling mechanism comprises a mechanical docking mechanism.

14. The lithographic apparatus of claim 13, wherein the mechanical docking mechanism comprises three docking elements that are connected to the stage, each of the docking elements having a positioning face that is at least partially spherical and wherein the intermediate body comprises three V-shaped grooves such that the three positioning faces and the three V-shaped grooves are adapted to cooperate in positioning and maintaining the intermediate body relative to the stage.

15. The lithographic apparatus of claim 11, wherein the coupling mechanism comprises an eddy current damping mechanism.

16. The lithographic apparatus of claim 11, wherein the coupling mechanism comprises:
a measuring mechanism configured to measure the relative position of the patterning device and the stage; and
a control mechanism configured to control the relative position of the patterning device and the stage.

17. The lithographic apparatus of claim 11, wherein the stage comprises:
a long stroke unit configured to move the patterning device over relatively large distances, and
a short stroke unit configured to move the patterning device over relatively small distances,
wherein the coupling mechanism is adapted to couple the reticle carrier with the short stroke unit.

18. The lithographic apparatus of claim 11, wherein the stage comprises:
a long stroke unit configured to move the patterning device over relatively large distances, and
a short stroke unit configured to move the patterning device over relatively small distances,
wherein the coupling mechanism is adapted to couple the reticle carrier with the long stroke unit.

19. The lithographic apparatus of claim 11, further comprising:
a measuring mechanism configured to measure the position of the patterning device relative to the stage after coupling the reticle carrier with the stage, and
a correction mechanism configured to generate one or more correction movements that optimize the relative position of the patterning device relative to the stage after coupling the reticle carrier with the stage.

20. The lithographic apparatus of claim 19, wherein the stage comprises:
a long stroke unit configured to move the patterning device over relatively large distances, and
a short stroke unit configured to move the patterning device over relatively small distances,
wherein the correction movements are performed by the short stroke unit.

21. The lithographic apparatus of claim 19, wherein the stage comprises:
a long stroke unit configured to move the patterning device over relatively large distances, and
a short stroke unit configured to move the patterning device over relatively small distances,
wherein the correction movements are performed by the long stroke unit.

22. The lithographic apparatus of claim 19, wherein the correction movements are performed by one or more dedicated actuators.

23. A device manufacturing method, comprising:
imparting a beam of radiation with a desired pattern in its cross-section by use of a patterning device;
projecting the patterned beam of radiation onto a target portion of a substrate during a projection phase, wherein the patterning device is carried by a stage during the projection phase;
exchanging the patterning device during an exchange phase;
positioning the patterning device relative to the stage via a positioning mechanism during the exchange phase, the positioning mechanism comprising a reticle carrier; and
coupling the reticle carrier with the stage during the exchange phase with a coupling mechanism that is separate from the patterning device.

24. A lithographic apparatus, comprising:
a substrate holder configured to hold a substrate;
an illuminator configured to condition a beam of radiation;
a support structure configured to support a patterning device that is configured to impart a desired pattern onto the beam of radiation, the support structure including a stage;
a projection system configured to project the patterned beam onto a target portion of the substrate;
a positioning mechanism configured to position the patterning device relative to the stage, the positioning mechanism including a reticle carrier, wherein the lithographic apparatus operates in accordance with an operational cycle comprising: (a) a projection phase, in which the projection system projects the patterned beam onto the substrate target portion and the stage carries the patterning device; and (b) an exchange phase, in which the patterning device is exchanged and the positioning mechanism positions the patterning device relative to the stage, the stage being adapted to perform a loading stroke that extends between an operational area for the patterning device and an exchange area for the patterning device; and a position measuring system configured to measure the position of the stage along a general plane defined by the patterning device, the position measuring system comprising a sensor that is configured to measure the position of the stage in a direction substantially perpendicular to a direction of the loading stroke, wherein the exchange area is arranged relative to the operational area such that the sensor is able to measure the position of the stage in the operational area during the projection phase and in the exchange area during the exchange phase.

25. The lithographic apparatus of claim 24, further comprising an additional measuring mechanism configured to measure the position of the stage perpendicular to the plane of the patterning device, the second measuring mechanism comprising a z-sensor.

26. The lithographic apparatus of claim 24, wherein the sensor comprises an interferometer.

27. A lithographic apparatus, comprising:
a substrate holder configured to hold a substrate;
an illuminator configured to condition a beam of radiation;
a support structure configured to support a patterning device that is configured to impart a desired pattern to the beam of radiation, the support structure including a stage;
a projection system configured to project the patterned beam onto a target portion of the substrate;
a positioning mechanism configured to position the patterning device relative to the stage, the positioning mechanism including a reticle carrier,
wherein the lithographic apparatus operates in accordance with an operational cycle comprising: (a) a projection phase, in which the projection system projects the patterned beam onto the substrate target portion and the stage carries the patterning device; and (b) an exchange phase, in which the patterning device is exchanged and the positioning mechanism positions the patterning device relative to the stage, the stage being adapted to perform a loading stroke that extends between an operational area for the patterning device and an exchange area for the patterning device; and
a position measuring system configured to measure the position of the stage substantially perpendicular to a general plane defined by the patterning device, the measuring system comprising a sensor, and
wherein the exchange area is arranged relative to the operational area such that the sensor is able to measure the position of the stage in the operational area during the projection phase and in the exchange area during the exchange phase.

28. The lithographic apparatus of claim 27, wherein the sensor comprises an interferometer.

29. A device manufacturing method, comprising:
providing a substrate that is at least partially covered by a layer of radiation-sensitive material;
conditioning a beam of radiation;
imparting the conditioned beam of radiation with a desired pattern in its cross-section by use of a patterning device;
projecting the patterned beam of radiation onto a target portion of the first substrate during a projection phase wherein the patterning device is carried by a stage during the projection phase;
exchanging the patterning device during an exchange phase;
wherein the stage is adapted to perform a loading stroke during the exchange phase, wherein the loading stroke extends between an operational area for the patterning device and an exchange area for the patterning device during the exchange phase,
wherein the position of the stage along a general plane defined by the patterning device is measured via a position measuring system that comprises a sensor that measures the position of the stage in a direction substantially perpendicular to the direction of the loading stroke, and
wherein the exchange area is arranged relative to the operational area such that the sensor is able to measure the position of the stage in the operational area during the projection phase and in the exchange area during the exchange phase.

30. A device manufacturing method, comprising:
providing a substrate that is at least partially covered by a layer of radiation-sensitive material;
imparting a beam of radiation with a desired pattern in its cross-section by use of a patterning device;
projecting the patterned beam of radiation onto a target portion of the first substrate during the projection phase wherein the pattering device is carried by a stage during the projection phase;
exchanging the patterning device during an exchange phase;
wherein the stage is adapted to perform a loading stroke during the exchange phase, wherein the loading stroke extends between an operational area for the patterning device and an exchange area for the patterning device,
wherein the position of the stage substantially perpendicular to a general plane defined by the patterning device is measured via a position measuring system that comprises a sensor, and
wherein the exchange area is arranged relative to the operational area such that the sensor is able to measure the position of the stage in the operational area during the projection phase and in the exchange area during the exchange phase.

31. The device manufacturing method of claim 30, further including measuring the position of the reticle stage perpendicular to the plane of the patterning device using an additional position measuring system, the additional position measuring system comprising another sensor, wherein the exchange area is arranged relative to the operational area such that the additional position measuring system is able to measure the position of the stage in the operational area during the projection phase and in the exchange area during the exchange phase.

* * * * *